(12) United States Patent
Tokuhira

(10) Patent No.: US 7,362,577 B2
(45) Date of Patent: Apr. 22, 2008

(54) ELECTRONIC COMPONENT AND RADIATING MEMBER, AND METHOD OF MANUFACTURING SEMICONDUCTOR DEVICE USING THE COMPONENT AND MEMBER

(75) Inventor: Hideshi Tokuhira, Himeji (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/204,120

(22) Filed: Aug. 16, 2005

(65) Prior Publication Data
US 2006/0028799 A1 Feb. 9, 2006

Related U.S. Application Data

(63) Continuation of application No. PCT/JP03/02006, filed on Feb. 24, 2003.

(51) Int. Cl.
H05K 7/20 (2006.01)
H01L 21/44 (2006.01)

(52) U.S. Cl. .............. 361/704; 361/705; 361/708; 361/717; 361/718; 361/722; 438/118

(58) Field of Classification Search ............ 361/705, 361/708
See application file for complete search history.

(56) References Cited

U.S. PATENT DOCUMENTS 4,081,825 A * 3/1978 Koopman et al. .......... 257/713
4,323,914 A * 4/1982 Berndlmaier et al. ....... 257/713
4,479,140 A * 10/1984 Horvath ...................... 257/713
5,325,265 A * 6/1994 Turlik et al. ................ 361/702
6,084,775 A * 7/2000 Bartley et al. .............. 361/705
6,281,573 B1 * 8/2001 Atwood et al. ............. 257/706
6,557,170 B1 * 4/2003 Wilder et al. ............... 725/130
6,757,170 B2 * 6/2004 Lee et al. .................... 361/704

FOREIGN PATENT DOCUMENTS

| EP | 0264892 | 4/1988 |
|---|---|---|
| JP | 58-199546 | 11/1983 |
| JP | 1-258448 | 10/1989 |
| JP | 2-65261 | 3/1990 |

* cited by examiner

Primary Examiner—Gregory D Thompson
(74) Attorney, Agent, or Firm—Staas & Halsey LLP

(57) ABSTRACT

A method for manufacturing an electronic component device in which an electronic component and a heat dissipating member are connected by a heat conducting member, the method comprising forming one of a plate shape metallic member and a recessed metallic member on the electronic component by a selected one of vapor deposition processing and plating processing, forming the other of the plate shape metallic member and the recessed metallic member on the heat dissipating member by a selected one of vapor deposition processing and plating processing, and filling a liquid metal in the recessed part of the recessed metallic member thereby to form the liquid metal, the plate shape metallic member and a part of the recessed metallic member into a solid solution.

4 Claims, 4 Drawing Sheets

ELECTRONIC COMPONENT AND RADIATING MEMBER, AND METHOD OF MANUFACTURING SEMICONDUCTOR DEVICE USING THE COMPONENT AND MEMBER

This application is a continuing application, filed under 35 U.S.C. §111(a), of International Application PCT/JP2003/2006, filed Feb. 24, 2003.

BACKGROUND OF THE INVENTION

1. Field of the Invention

The present invention relates generally to an electronic component and heat dissipating member, and a method for semiconductor manufacturing through the use of them. More particularly, the invention relates to a heat conducting member which connects an electronic component and a heat dissipating member.

2. Description of the Related Art

In these years, information processing units are demanded to provide higher functions and higher performances. To realize the units having these characteristics, the electronic components used in the units also have improved in their functions and processing-speed.

However, since the resultant improvement increases heat generated in the electronic components, the heat generated has been liable to cause erroneous operations in and lower performance of the units. Accordingly, effective heat-dissipating and cooling the electronic component are demanded.

One of the generally used cooling technologies is that in which the heat generated in the electronic component is radiated into the air through conducting the heat to a heat sink tightly connected to the electronic component. However, in the technology, the poor degree of contact between the electronic component and the heat sink results in low thermal conduction.

A method of one improving the defect of prescribing technology is disclosed in the unexamined published application Tokkai 2002-30217 in which an effective heat conduction is provided by increasing the thermal connection between the electronic component and the heat sink with tightly connecting each other by thermal conductive resin including filler for thermal conduction.

Another cooling technology is disclosed the unexamined published application Tokkai-Sho 63-102345. The cooling technology disclosed in the publication is related to the improvement of heat conduction with connecting tightly an electronic component and a heat radiating member for increasing the thermal transfer from the component to the heat radiating member through a heat conductive alloy. The heat conductive alloy is a metal in the coagulation state of indium as metal and gallium as liquid metal.

Further the patent application 2002-140316 discloses a method for cooling which adopts a method for improving a heat transferring ratio between electronic component and a heat radiating member in the way of connecting the component and the member with a thermal conducting alloy made of metal indium and liquid metal. The thermal conducting alloy is surrounded by a bank for preventing spill-over of the alloy since the alloy is liquid.

However the disclosed technology in the unexamined published application Tokkai 2002-30217 has an adverse effect as a low thermal conducting ratio because the electronic component and the heat sink as the heat dissipating member are bonded through thermal conductive resin. Further the disclosed technology in the unexamined published application Tokkai-Sho 63-102345 is that an electronic component and a heat sink are adhered and connected through metal in a state of semi-coagulation. Accordingly, the technology has such a problem that the metal in the state of semi-coagulation makes short-circuits in a printed circuit board or electronic components when the metal flows out and is scattered around. More further the disclosed technology in the patent application 2002-140316 results in increases of the number and cost of parts, and steps of manufacturing because of the bank preventing the flow-out of the liquid metal.

SUMMARY OF THE INVENTION

The object of the present invention is to increase a thermal conductivity between an electronic component and a heat dissipating member by means of increasing the degree of contact for heat-conducting between the heat dissipating member and a heat conducting member. As a result, an effect of heat dissipation from the electronic part is improved. Further the present invention provides a new electronic component device which prevents short-circuits in a surrounding printed circuit board and/or electronic components, and which can be produced without increasing the number of parts, cost of parts, and steps of manufacturing thereof.

The present invention relates to an electronic component device in which an electronic component and a heat dissipating member are connected through a heat conducting member. For further details, a metallic member as a heat conducting member is provided on each of the electronic component and the heat dissipating member respectively, where the metallic member is formed by means of vapor deposition or metal plating. And each of the metallic members is formed into solid solution with a liquid metal and fixed to each other. Accordingly, the electronic component and the heat dissipating member are connected through a heat conducting member as solid solution comprising the metallic members and the liquid metal. The contact area for heat conduction between the electronic component and the heat conducting member results in larger. Furthermore a heat conductivity between the metallic member as a heat conducting member and the liquid metal is increased. Since the solid solution of the metallic member and the liquid metal is formed at a room temperature, the electronic components are free of heat stress.

And furthermore the recessed metallic member is integrally formed with a bottom part and a bank part, where the bank is projection-like and disposed at a periphery of the bottom, and the liquid metal is filled in the recess portion and formed into a solid solution. Therefore the liquid metal is sealed in the recess portion and cannot flow out from the recess portion. As a result, the short-circuits in printed circuits or electronic components around the recessed metallic member can be prevented. Since the recessed metallic member is integrated with the bank and the bottom as a single piece without using a plurality of parts, a decrease in the number of parts and the suppression of increase in steps are can be achieved.

The metallic member comprises indium (symbol of element: In), and a liquid metal is at least one of Ga, Ga—In alloy (gallium and indium alloy), Ga—In—Sn alloy (gallium, indium, and tin alloy), Ga—In—Zn alloy (gallium, indium, and zinc alloy), Ga—Sn alloy (gallium and tin alloy), Ga—Zn alloy (gallium and zinc alloy). Therefore the metallic member and a liquid metal which form a heat conducting member coagulate and form solid solution. The configuration increases the degree of contact for heat conduction and improves a coefficient of thermal conductivity. As a result, the heat generated in electronic components is effectively radiated.

Further, the metal member provided to electronic components or heat dissipating member is formed with metal plating processing or vapor deposition processing. Accordingly, the formation increases the degree of the contact of heat conduction between an electronic component and a heat conducting member, and increases also the degree of the contact between a heat dissipating member and heat conducting member. As a result, the formation can improve the heat dissipating effect.

DESCRIPTION OF THE PREFERRED EMBODIMENTS

Figure 1:
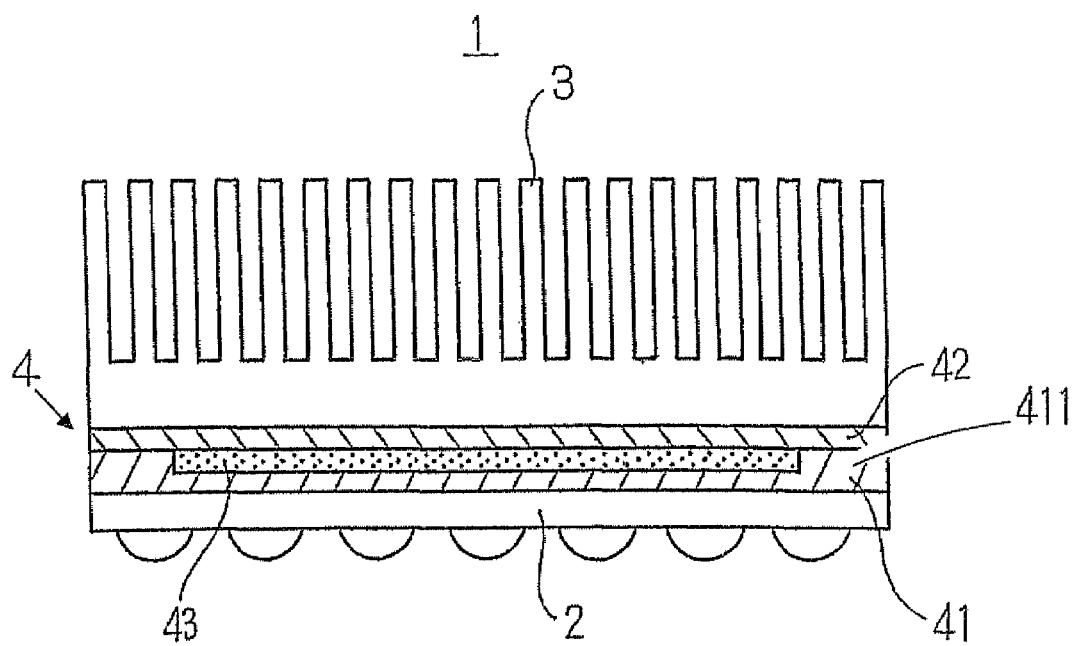
FIG. 1 shows a diagram of the electronic component device concerning this invention.

An embodiment of the present invention is explained with respect to the drawings. FIG. 1 shows the structure of the electronic component device 1 of the present invention.

Reference 1 indicates the electronic component device, reference 2 indicates an electronic component, such as a semiconductor component, reference 3 indicates a heat dissipating member made of metal having high heat conducting ratio, such as aluminum, reference 4 indicates a heat conducting member, reference 41 indicates a recessed metallic member, reference 411 indicates a projecting bank section of the recessed metallic member, reference 412 indicates the bottom of the recessed metallic member, reference 42 is a plate shape metallic member, and reference 43 indicates a liquid metal.

In this electronic component device 1, the electronic component 2 and the heat dissipating member 3 are connected with the heat conducting member 4. The heat conducting member 4 is formed with the recessed metallic member 41, the plate shape metallic member 42, and the liquid metal 43. The recessed metallic member 41 is integrally formed with the bottom 412 and the projecting bank section 411 disposed at the peripheral portion of the recessed metallic member 41. The projecting bank section 411 at the periphery portion and the bottom 412 are formed by plating treatment.

Specifically, the recessed metallic member 41 of the heat conductor 4 is formed in the upper part of the electronic component 2 by plating. The plate shape metallic member 42 of the heat conductor 4 is formed in the lower part of the dissipating member 3 by plating. And the bottom 412 surrounded by the projecting bank section 411 of the recessed metallic member 41 is filled up with the liquid metal 43. For example, an alloy including Ga with high heat conductivity high can be used as a liquid metal 43. A metal which can mutually form a solid solution with the above mentioned liquid metal 43 and not decrease the heat conductivity when the metal forms a solid solution is preferable as a material for the recessed metallic member 41 and the plane shape metallic member 42, indium (symbol of element: In) or a alloy including indium is elected as the material.

This electronic component device 1 is mounted on the circuit board, and works. The electronic component device 1 produces heat when it is working. The heat produced by the electronic component 1 is conducted through the heat conducting member 4 and then dissipated at the heat dissipating member 3. Accordingly, the electronic component is cooled and kept at a suitable temperature, and works steadily or continually.

Figure 2:
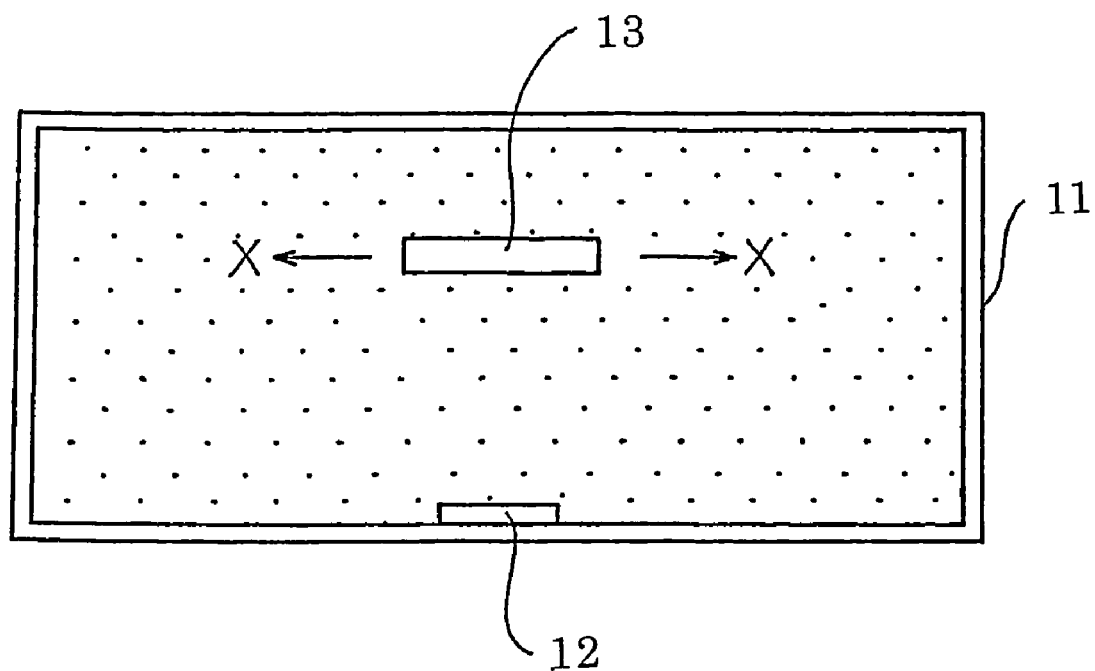
FIG. 2 shows a schematic diagram of a plating unit which manufactures the electronic component device concerning an embodiment of the invention.

A plating unit 10 for manufacturing the electronic component device is explained in connection with FIG. 2. This plating unit 10 can fill plating liquid in a plating bath 11, and can prepare for plating, for example, In, using an anode pole 12 and a cathode pole 13, a required current being provided between the anode and cathode poles.

Figure 3:
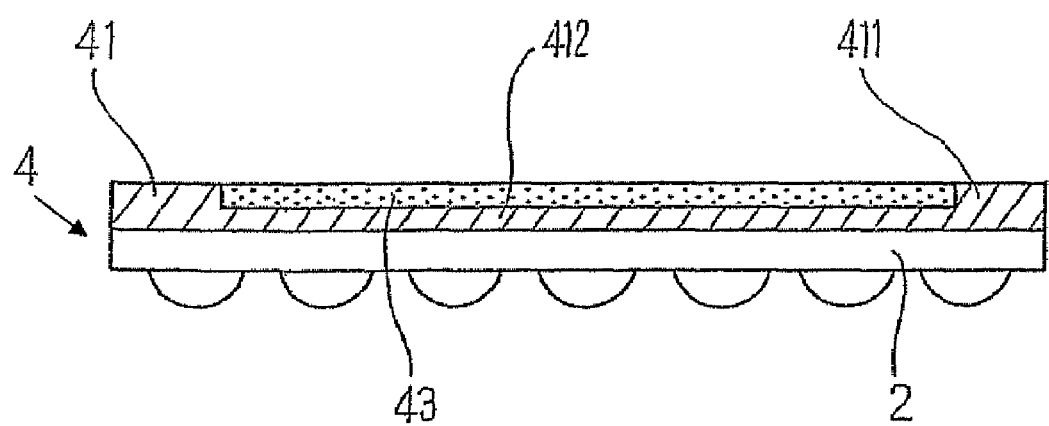
FIG. 3 shows a schematic diagram of the electronic components concerning the embodiment.

Referring to FIG. 3, the manufacturing process for the electronic component is explained.

(1) At first, the electronic component 2 is prepared. And then, the portions not to be plated are masked. For example, resin, as a resist, is applied over such portions The electronic component 2 is attached to the hanger of the plating unit 10 after that, and it lays in the plating bath of the plating unit 10.

(2) Next, an acid immersion processing is carried out. As for processing conditions, the acid solution is a sulfuric acid of about 10% of concentration, and a temperature of the solution is maintained at room temperature, for example, 15° C. And the electronic component 2 is swung gently with the amplitude of about 75 mm in a stroke of about 30 seconds within a plating bathtub. And after losing the oil film and dirt in the plating treatment area, the electronic component 2 is rinsed for removing the sulfuric acid solution.

(3) The electronic component 2 is nickel-plated continuously. As for plating conditions, for example, pH of Watts bath is about pH4.5, the current density is 4 A square dm, and the temperature of the solution is about 50° C. The electronic component 2 is swung gently with a stroke amplitude of about 75 mm of so as to form an underplate, while the plating solution is being stirred. The electronic component 2 is rinsed to remove the plating solution.

(4) Next, an acid immersion processing is carried out. As for details of processing conditions, the acid solution is Dainsilver (Daiwakasei Kabushikikaisha: trade name ACC) of about 10% of concentration, and the solution is maintained at room temperature. The electronic component 2 is swung gently with the amplitude of about 75 mm of stroke within the plating bathtub for about 30 seconds. And the oil film and dirt in the plating treatment area are removed. Then the electronic component 2 is rinsed for removing the acid solution.

(5) Next, a strike In plating processing is carried out. As for plating processing conditions, for example, plating solution is DAININ-PL30 (Daiwakasei kabushikikaisha: the chief ingredient is methanesulfonic acid indium), current density is about 7.5 A/square dm, and the temperature of the acid solution is about 50° C. Strike plating is carried out while the electronic component 2 is swung gently with a stroke amplitude of about 75 mm while the plating solution is being stirred.

(6) Next, In plating processing is carried out. As for plating processing conditions, for example, for plating solution is DAININ-PL30 (Daiwakasei Kabushikikaisha: the chief ingredient is methanesulfonic acid indium), current density is about 0.5 A/square din, and the temperature of the plating solution is about 50° C. Plating is carried out while the electronic component 2 is swung gently with a stroke amplitude of about 75 mm and while the plating solution is being stirred. The thickness of this In plating is about 0.1 mm. The plating was provided in a plate shape in the area except for the portion of the electronic component 2 on which the resin, as a resist, was applied.

(7) Next, the resin as a resist is applied on the plate of this plating. The domain on which the resin, as a resist, is applied is a domain except for the projecting bank section 411 at the periphery part of the electronic component 2. The resin, as resist, is PDF100 (trade name) produced by Shinnittetsu-kagaku kabushikikaisha. As for conditions for laminating, a temperature is about 80° C. and the degree of vacuum is about 0.3 MPa.

(8) Next, a plating processing is carried out. As for processing conditions, for example, the plating solution is DAININ-PL30 (Trade name available from Daiwakasei Kabushikikaisha: chief ingredient is methanesulfonic acid indium), the current density is about 0.5 A/square dm (wherein "dm"=decimeter, or 10 cm), and the temperature of the plating solution is about 50° C. The plating is carried out, while the solution is stirred by air blowing and the electronic component 2 is swung gently with a stroke amplitude of about 75 mm. The thickness of In plating is about 0.02 mm. Therefore, the recessed metallic member 41 of the heat conduction member 4 has been formed in the electronic component 2. The dimensions of the formed shape are: the thickness of the bottom is about 0.1 mm; the internal height of the projecting bank section 411 in the recessed metallic member 41 is about 0.02 mm; and the width is about 5 mm.

Thus, in order for electronic component 2 to have a recessed metallic member 41 formed by plating processing, the degree of contact for heat conduction is good. And the projecting bank section 411 formed at the periphery part of the recessed metallic member 41 and the bottom 412 are formed in one plating processing. For this reason, the reduction of parts and the prevention of increase in a manufacture can be performed without preparing another parts.

(9) Next, the resin, as resist, used by the above-mentioned manufacturing process is removed. If exfoliation liquid is used, it can carry out the resist easily.

Figure 4:
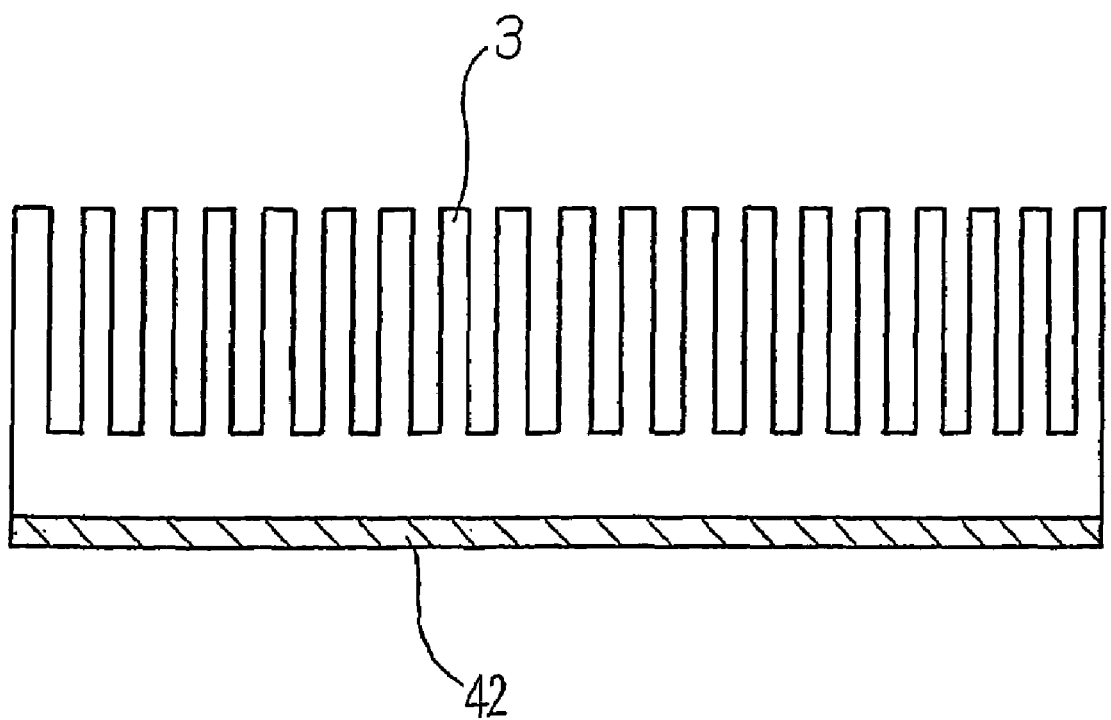
FIG. 4 is a schematic diagram of the heat dissipation member concerning the embodiment.

(10) Next, the plate shape metallic member 42 is formed on the heat dissipation member 3. The manufacturing method of the heat dissipation member 3 is explained with reference to FIG. 4. The plate shape metallic member 42 is formed by a manufacturing method using the plating art mentioned above. Plating processing is carried out and the heat dissipation member 3 is plated, as mentioned above, to form the plate shape metallic member 42 in the bottom of the heat dissipation member 3 as seen in FIG. 4. The degree of contact of the heat conduction of the heat dissipation member 3 and the plate shape metallic member 42 is good, because of this plating processing.

(11) The liquid metal 43, specifically liquid gallium (symbol of element: Ga), is filled up in the portion surrounded by the projecting bank formed in the electronic components 2. A dispenser apparatus performs a filling method.

(12) The electronic components and the heat dissipation member 3 mentioned above are stacked. Therefore, each of the metal members 41, 42 and the liquid metal 43 solidifies, and they become a solid solution. The solid solution is formed in a normal temperature for several tens of hours. For this reason, heat stress is not given to the electronic component. Liquid metal 43 is liquefied until it becomes a solid solution, but since it is surrounded by the projecting bank section 411, it does not leak to the circumference. If the solid solution is completed, the metal members 41, 42 and the liquid metal 43 adhere each other, and the electronic component device 1 is completed.

Other Embodiments

The above-mentioned embodiment explained the example which uses Ga for liquid metal. However, the same effect is obtained even if a 75.5% Ga-24.5% In alloy, 62% Ga-25% In-13% Sn alloy, 67% Ga-29% In-4% Zn alloy, 92% Ga-8% Sn alloy, or 95% Ga-5% Zn alloy is used as the liquid metal.

In the above-mentioned embodiment, the recessed metallic member 41 is formed on the electronic component 2, and the plate shape metallic member 42 is formed at the heat dissipation member 3. However, an electronic component device 1 is mounted in a circuit board in various states. According to the state of mounting the electronic component device 1, the plate shape metallic member 42 may be formed on the electronic component 2, and recessed metal member may be formed in the heat dissipation member 3.

INDUSTRIAL APPLICABILITY

As explained above, the electronic component device provided by the present invention increases the degree of contact of the heat conduction of electronic components and a thermally conductive member, and increases the degree of contact of the heat conduction of a heat dissipation member and a thermally conductive member. As a result, a radiation effect of electronic components can be raised. Further, short circuits in a circuit board and electronic components close to the electronic component device are prevented, and an increase of the number of parts and steps for manufacturing are suppressed.

What is claimed is:

1. A method for manufacturing a semiconductor device having an electronic component connected and a heat dissipating member, comprising:

forming by plating processing or vapor deposition processing, on the electronic component, a recessed metallic member having a central recess surrounded by a bank section extending to a periphery of the recessed metallic member;

filing a liquid metal into the recessed metallic member;

forming by plating processing or vapor deposition processing, on the heat dissipating member, a plate shape metallic member;

securing the electronic component to the heat dissipating member so to seal the liquid metal; and forming a solid solution of said liquid metal, a part of said plate shape metallic member and a part of said recessed metallic member.

2. A method for manufacturing a semiconductor device according to claim 1, wherein said plate shape metallic member and said recessed metallic member are formed of indium and said liquid metal is formed of at least one of gallium-gallium-indium alloy, gallium-indium-tin alloy, gallium-indium-zinc alloy, gallium-tin alloy, and gallium-zinc alloy.

3. A method for manufacturing a semiconductor device having an electronic component connected with a heat dissipating member, comprising:

forming a recessed metallic member on the heat dissipating member by plating processing or vapor deposition processing;

forming a plate shape metallic member on said electronic component by plating processing or vapor deposition processing;

filling a liquid metal into said recessed metallic member; and forming a solid solution of said liquid metal, a part of said plate shape metallic member and a part of said recessed metallic member.

4. A method for manufacturing a semiconductor device according to claim 3, wherein said plate shape metallic member and said recessed metallic member are formed of indium and said liquid metal is formed of at least one of gallium-gallium-indium alloy, gallium-indium-tin alloy, gallium-indium-zinc alloy, gallium-tin alloy, and gallium-zinc alloy.

* * * * *

UNITED STATES PATENT AND TRADEMARK OFFICE
CERTIFICATE OF CORRECTION

PATENT NO.         : 7,362,577 B2
APPLICATION NO.    : 11/204120
DATED              : April 22, 2008
INVENTOR(S)        : Hideshi Tokuhira It is certified that error appears in the above-identified patent and that said Letters Patent is hereby corrected as shown below:

On the title page, item [57]:

Column 2 (Abstract), Line 13, before "and" change "member" to --member,--.

Signed and Sealed this

Second Day of September, 2008

JON W. DUDAS
*Director of the United States Patent and Trademark Office*